(12) United States Patent
Sanga

(10) Patent No.: US 12,410,900 B2
(45) Date of Patent: Sep. 9, 2025

(54) LIGHT-EMITTING MODULE

(71) Applicant: NICHIA CORPORATION, Anan (JP)

(72) Inventor: Daisuke Sanga, Tokushima (JP)

(73) Assignee: NICHIA CORPORATION, Anan (JP)

( * ) Notice: Subject to any disclaimer, the term of this patent is extended or adjusted under 35 U.S.C. 154(b) by 450 days.

(21) Appl. No.: 17/959,311

(22) Filed: Oct. 4, 2022

(65) Prior Publication Data

US 2023/0126154 A1    Apr. 27, 2023

(30) Foreign Application Priority Data

Oct. 27, 2021   (JP) .................. 2021-175418

(51) Int. Cl.
*F21S 41/153*    (2018.01)
(52) U.S. Cl.
CPC .................. *F21S 41/153* (2018.01)
(58) Field of Classification Search
CPC ..... F21V 23/005; F21S 41/192; F21S 41/151; F21S 41/153
See application file for complete search history.

(56) References Cited

U.S. PATENT DOCUMENTS

| | | | |
|---|---|---|---|
| 9,293,670 B2 * | 3/2016 | Toita | H10H 20/854 |
| 11,373,991 B2 * | 6/2022 | Hin | H01L 25/18 |
| 2002/0056900 A1 | 5/2002 | Liu et al. | |
| 2007/0176274 A1 | 8/2007 | Yoneda et al. | |
| 2009/0053850 A1 * | 2/2009 | Nishida | H10F 39/011 |
| | | | 257/E21.001 |
| 2013/0170688 A1 | 7/2013 | Cohen et al. | |
| 2017/0236866 A1 * | 8/2017 | Lee | H10H 29/14 |
| | | | 257/89 |
| 2018/0090649 A1 | 3/2018 | Nishioka | |
| 2018/0190553 A1 | 7/2018 | Lin et al. | |
| 2019/0081028 A1 * | 3/2019 | Komiyama | G02B 1/11 |
| 2020/0078317 A1 | 3/2020 | Parsa et al. | |
| 2020/0343422 A1 * | 10/2020 | Yamamoto | H01L 25/165 |
| 2023/0349525 A1 * | 11/2023 | Hayashi | H10H 20/8516 |

FOREIGN PATENT DOCUMENTS

| | | |
|---|---|---|
| JP | 03-038884 | 2/1991 |
| JP | 10-144898 | 5/1998 |
| JP | 2001-274370 | 10/2001 |
| JP | 2006-041270 | 2/2006 |
| JP | 2006-186288 | 7/2006 |

(Continued)

*Primary Examiner* — Eric T Eide
(74) *Attorney, Agent, or Firm* — MORI & WARD, LLP

(57) ABSTRACT

A light-emitting module including a first wiring substrate, a second wiring substrate located on the first wiring substrate, a plurality of light-emitting elements located on the second wiring substrate, a wire connecting a first terminal of the first wiring substrate and a second terminal of the second wiring substrate, a first resin located on the first wiring substrate and on the second wiring substrate, and a protective member located on the first resin. The first resin covers the wire and surrounds the plurality of light-emitting elements when viewed in plan view. The protective member includes a light-transmitting member covering the first resin when viewed in plan view, and a light-shielding film located at a surface of the light-transmitting member. The light-shielding film covers the first resin when viewed in plan view.

17 Claims, 11 Drawing Sheets

(56) References Cited

FOREIGN PATENT DOCUMENTS

| | | |
|---|---|---|
| JP | 2008-270478 | 11/2008 |
| JP | 2013-141257 | 7/2013 |
| JP | 2014-075480 | 4/2014 |
| JP | 2018-056268 | 4/2018 |
| JP | 2018-125368 | 8/2018 |
| JP | 2019-079951 | 5/2019 |
| JP | 2020-021904 | 2/2020 |
| JP | 2020-040946 | 3/2020 |
| JP | 2021-009898 | 1/2021 |
| WO | WO2021/158871 | 8/2021 |

\* cited by examiner

LIGHT-EMITTING MODULE

CROSS-REFERENCE TO RELATED APPLICATIONS

This application is based upon and claims the benefit of priority from the prior Japanese Patent Application No. 2021-175418, filed on Oct. 27, 2021; the entire contents of which are incorporated herein by reference.

BACKGROUND

Embodiments of the disclosure relate to light-emitting modules.

In recent years, light-emitting modules that can individually drive multiple light-emitting elements have been used as light sources of adaptive driving beams (ADBs) and the like. ADBs are designed to project a desired light distribution pattern frontward by controlling the lighting pattern of the multiple light-emitting elements.

SUMMARY

The light-emitting module may be damaged if external light such as sunlight or the like travels backward through the optical system and is concentrated at the light-emitting surface vicinity.

According to one aspect of the present invention, a light-emitting module includes a first wiring substrate, a second wiring substrate located on the first wiring substrate, a plurality of light-emitting elements located on the second wiring substrate, a wire connecting a first terminal of the first wiring substrate and a second terminal of the second wiring substrate, a first resin located on the first wiring substrate and on the second wiring substrate, and a protective member located on the first resin. The first resin covers the wire and surrounding the plurality of light-emitting elements when viewed in plan view. The protective member includes a light-transmitting member covering the first resin when viewed in plan view, and a light-shielding film located at a surface of the light-transmitting member. The light-shielding film covers the first resin when viewed in plan view.

According to an embodiment, a light emitting module capable of suppressing damage due to external light can be realized.

DETAILED DESCRIPTION

Figure 1:
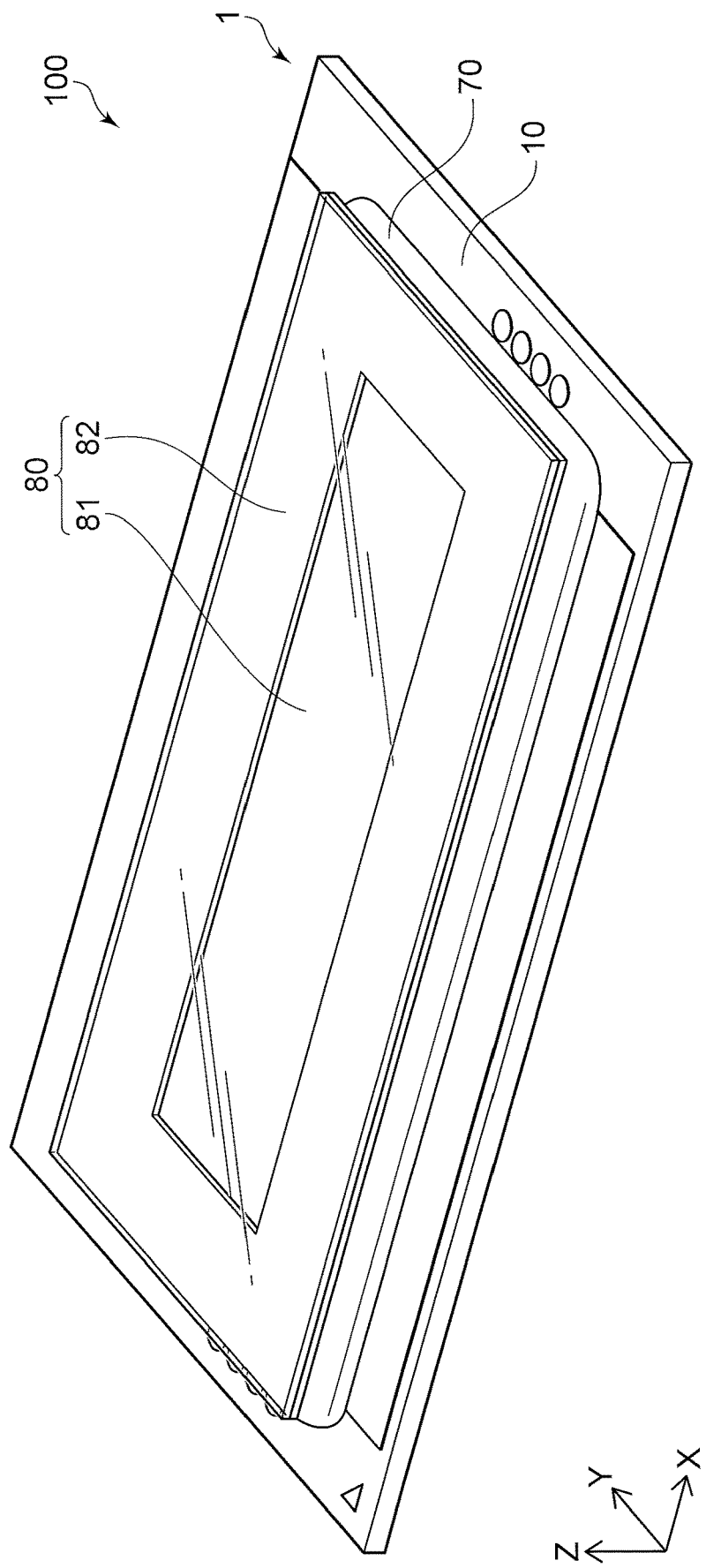
FIG. 1 is a perspective view showing a light-emitting module according to a first embodiment when viewed obliquely from above.

Embodiments of the invention will now be described with reference to the drawings. The drawings are schematic and are enhanced or simplified as appropriate. For example, in some of the drawings, compared to the light-emitting module, the light-emitting elements are illustrated larger than actual sizes, and the protective members are illustrated thicker than actual thicknesses. The dimensional ratios of the components do not always match between the drawings. End views that show only cross sections may be used as cross-sectional views.

First Embodiment

A light-emitting module 1 according to a first embodiment includes a first wiring substrate 10, a second wiring substrate 20 located on the first wiring substrate 10, multiple light-emitting elements 30 located on the second wiring substrate 20, a wire 60 connecting a first terminal 12 of the first wiring substrate 10 and a second terminal 22 of the second wiring substrate, a first resin 70, and a protective member 80 located on the first resin 70. The first resin 70 is located on the first wiring substrate 10 and on the second wiring substrate 20, covers the wire 60, and surrounds the multiple light-emitting elements 30 when viewed in plan view. The protective member 80 includes a light-transmitting member 81 that covers the first resin 70 when viewed in plan view, and a light-shielding film 82 that is located at the surface of the light-transmitting member 81 and covers the first resin 70 when viewed in plan view.

FIG. 1 is a perspective view showing the light-emitting module according to the embodiment when viewed obliquely from above.

Figure 2:
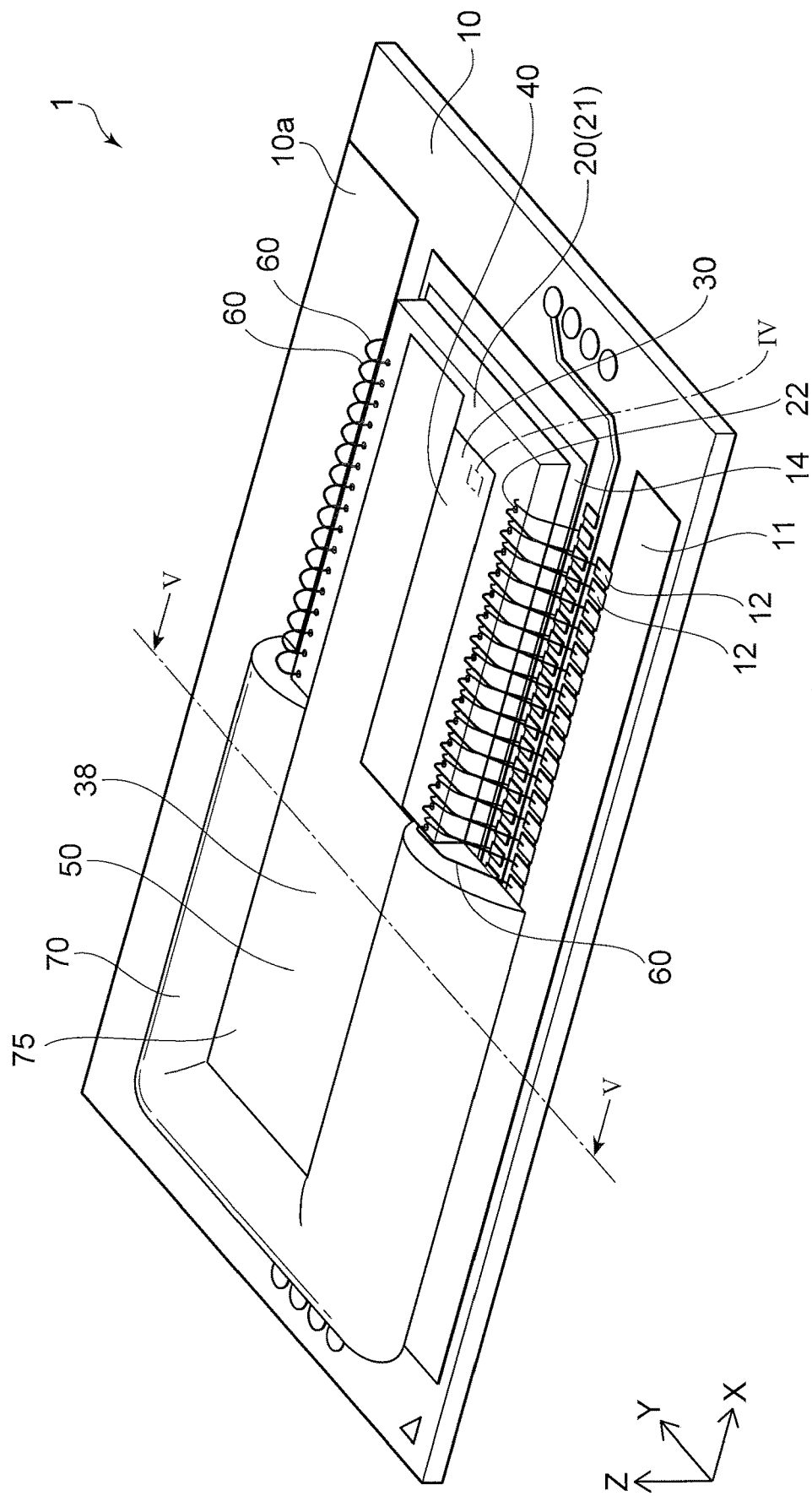
FIG. 2 is a perspective view showing the light-emitting module according to the first embodiment when viewed obliquely from above.

FIG. 2 is a perspective view showing the light-emitting module according to the embodiment when viewed obliquely from above.

Figure 3:
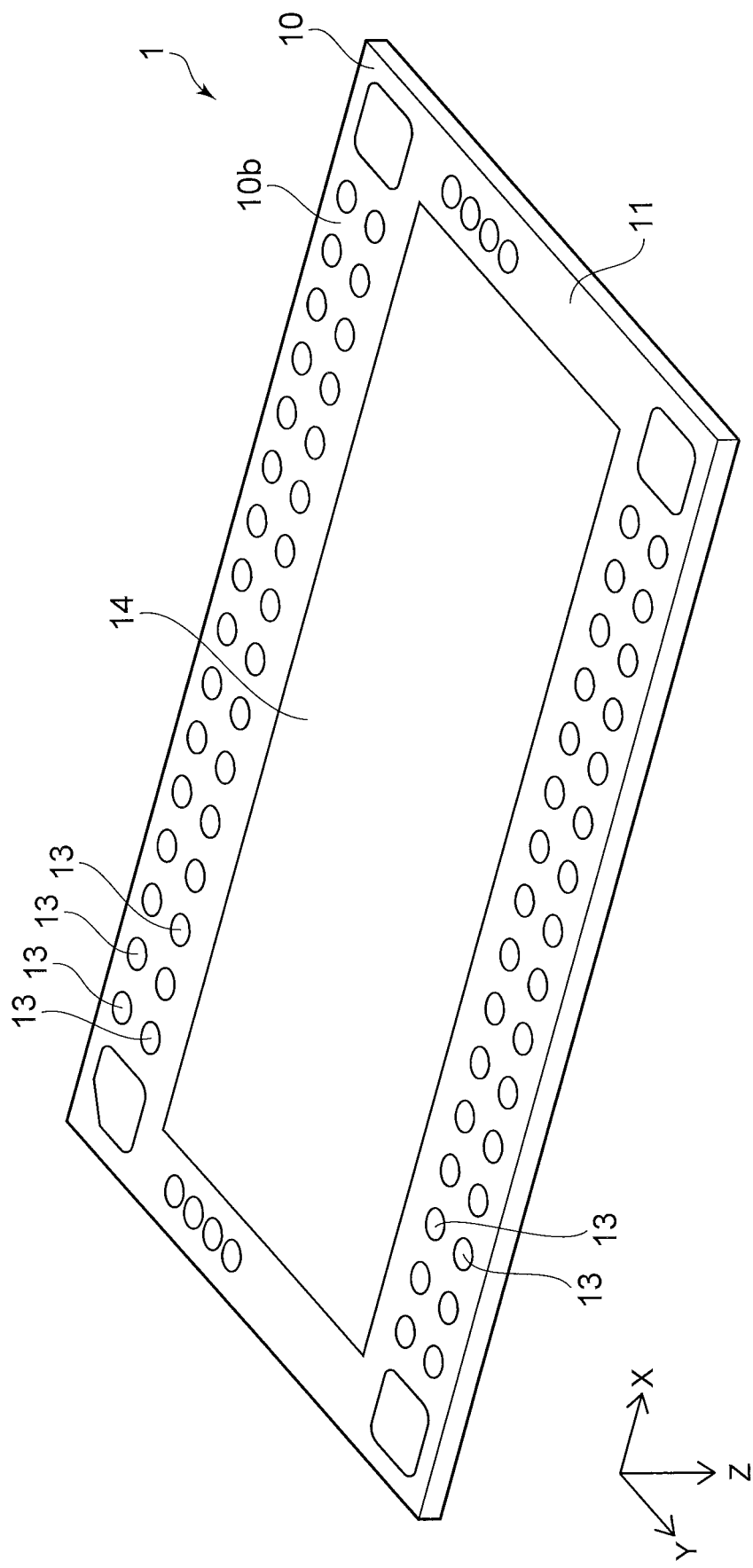
FIG. 3 is a perspective view showing the light-emitting module according to the first embodiment when viewed obliquely from below.

FIG. 3 is a perspective view showing the light-emitting module according to the embodiment when viewed obliquely from below.

Figure 4:
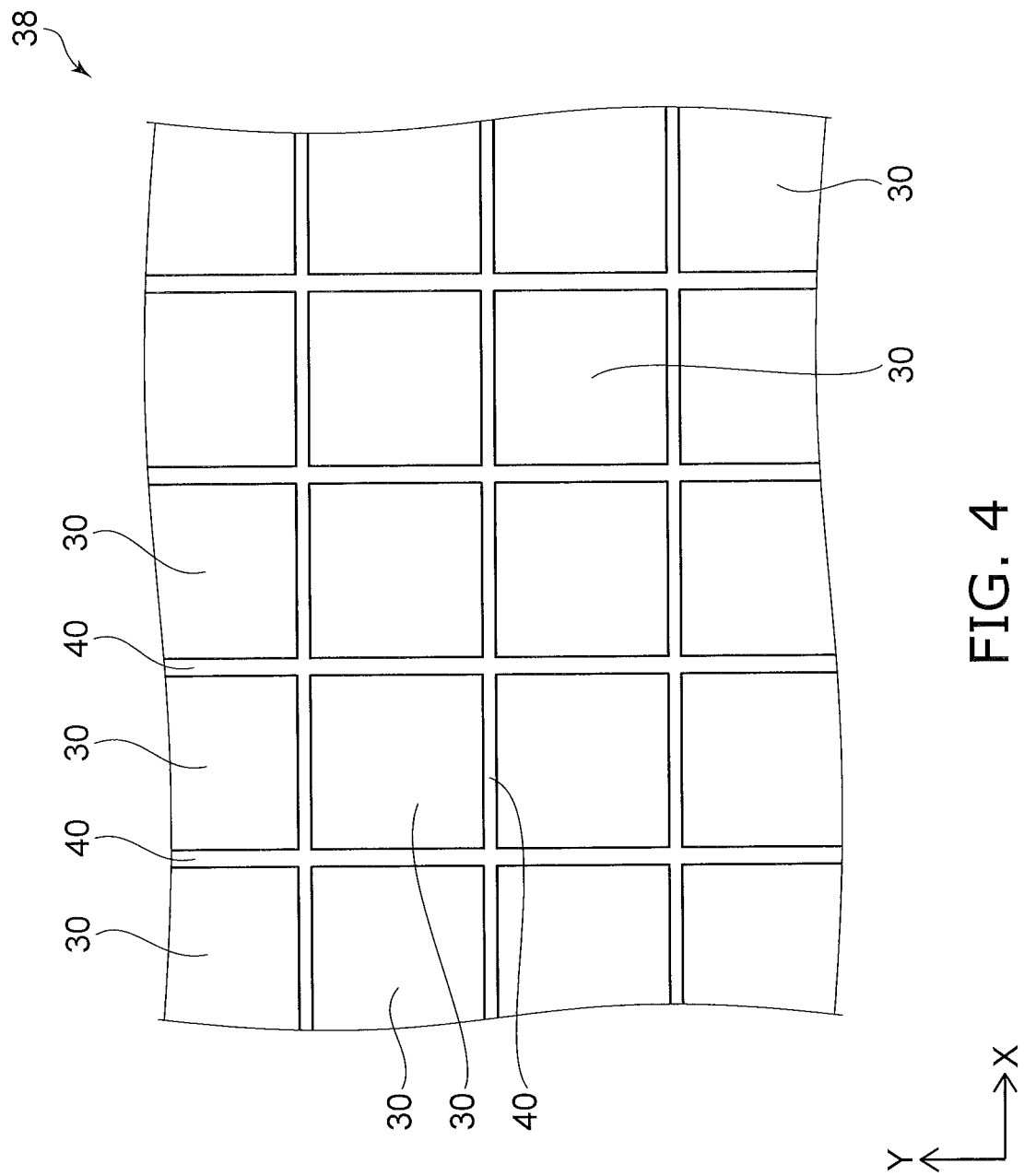
FIG. 4 is an enlarged plan view showing region IV of FIG. 2.

FIG. 4 is an enlarged plan view showing region IV of FIG. 2.

Figure 5:
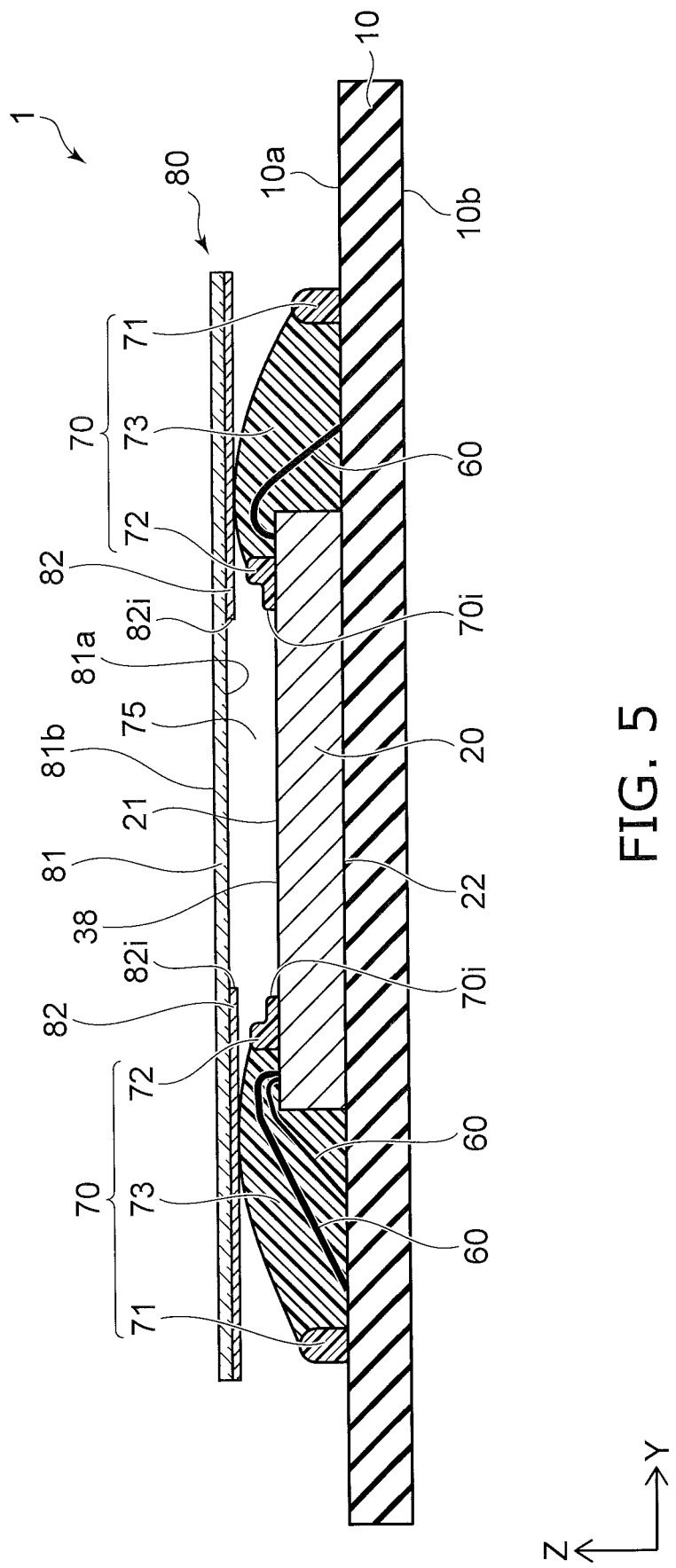
FIG. 5 is a cross-sectional view along line V-V shown in FIG. 2.

FIG. 5 is a cross-sectional view along line V-V shown in FIG. 2.

Figure 6:
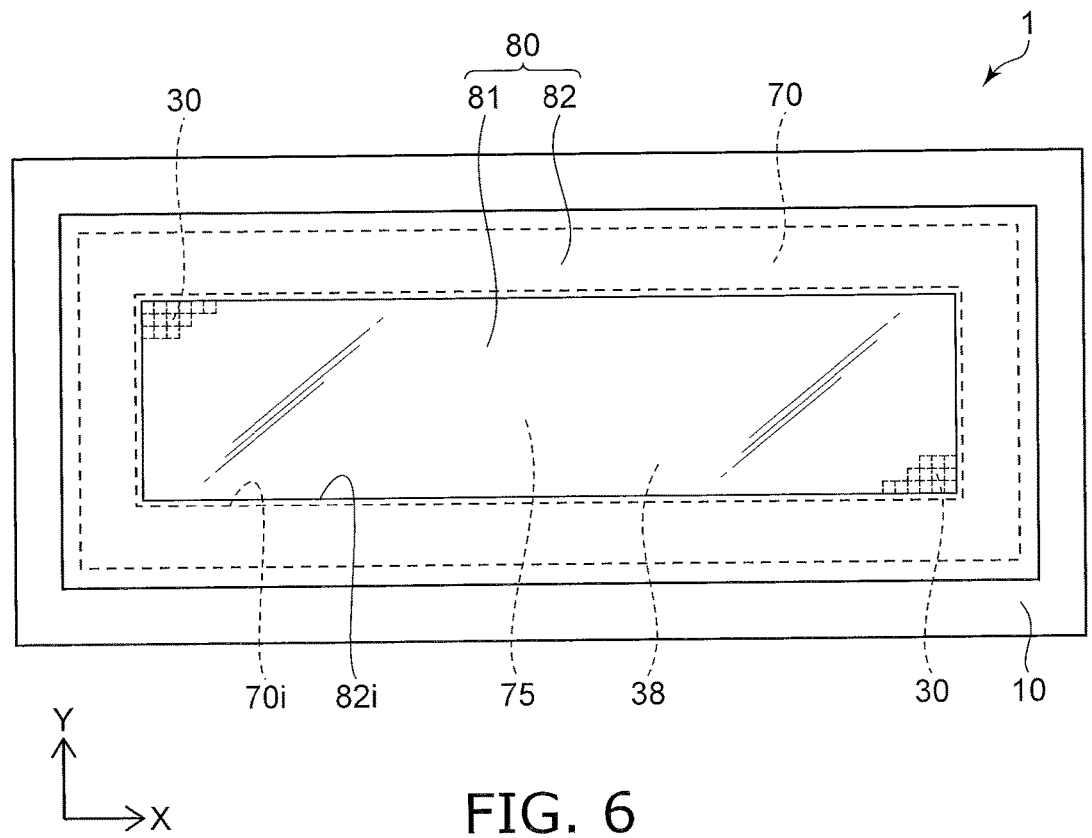
FIG. 6 is a plan view showing the light-emitting module according to the first embodiment.

FIG. 6 is a plan view showing the light-emitting module according to the embodiment.

Figure 7:
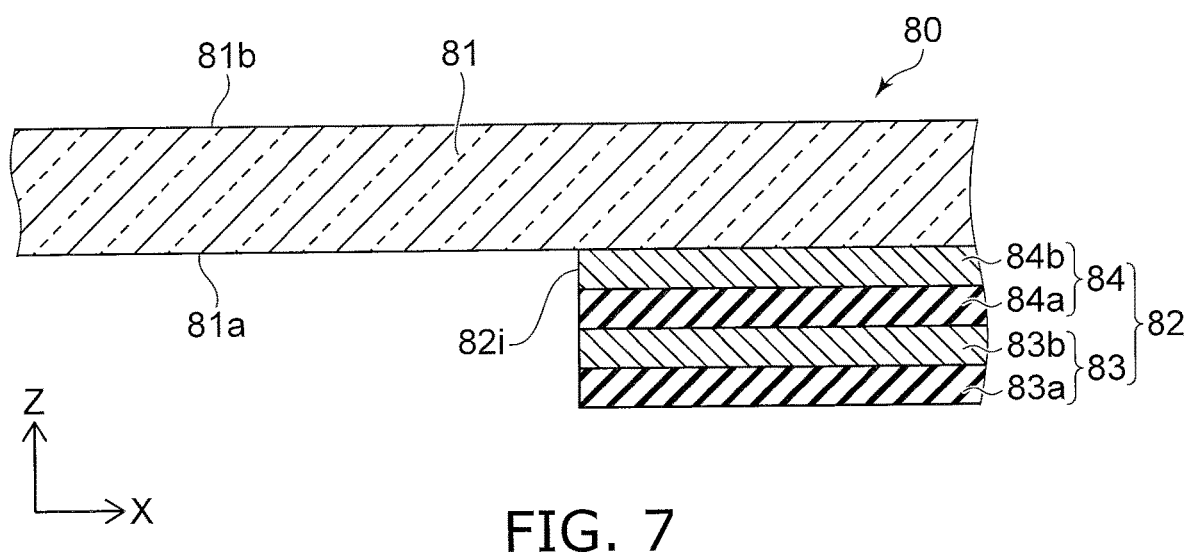
FIG. 7 is a cross-sectional view showing a protective member according to the first embodiment.

FIG. 7 is a cross-sectional view showing the protective member according to the embodiment.

The protective member 80 is not illustrated in FIGS. 2 to 4.

In the specification, an XYZ orthogonal coordinate system is employed for convenience of description. The direction from the first wiring substrate 10 toward the protective member 80 is taken as a "Z-direction". The longitudinal direction of the light-emitting module 1 is taken as an "X-direction"; and the transverse direction is taken as a "Y-direction". Although the Z-direction also is called "up", and the opposite direction of the Z-direction also is called "down", these expressions are for convenience and are independent of the direction of gravity. In the specification, the expression "when viewed in plan view" means when viewed from the Z-direction.

As shown in FIGS. 1 to 3, the light-emitting module 1 of the embodiment includes the first wiring substrate 10, the second wiring substrate 20, the multiple light-emitting elements 30, a second resin 40, a third resin 50, the multiple wires 60, the first resin 70, and the protective member 80. For convenience of illustration in FIG. 2, the entire protective member 80, a portion of the first resin 70, and a portion of the third resin 50 are not illustrated so that a portion of the wire 60, a portion of the light-emitting element 30, etc., are visible.

The first wiring substrate 10 includes, for example, a flat-plate base body 11, and wiring located at least at the upper surface of the base body 11. The first wiring substrate 10 can have a flat plate shape, or can have a cavity in the upper surface to house the second wiring substrate 20. It is favorable for the material of the base body 11 to have good heat dissipation, and more favorable to have a high light-shielding property and strength. Specifically, examples of the material of the base body 11 include metals such as aluminum (Al), copper (Cu), and the like, ceramics such as aluminum oxide, aluminum nitride, silicon nitride, mullite, and the like, resins such as phenol, epoxy, polyimide, BT (bismaleimide triazine), polyphthalamide (PPA), and the like, a composite including a resin, a metal, or a ceramic, etc. Examples of the material of the wiring include, for example, metals such as copper (Cu), silver (Ag), gold (Au), aluminum (Al), platinum (Pt), titanium (Ti), tungsten (W), palladium (Pd), iron (Fe), nickel (Ni), and the like, alloys of such metals, etc.

As an example, the first wiring substrate 10 includes a stack of metallic members of aluminum (Al), copper (Cu), or the like and an insulating member such as an epoxy resin or the like, and wiring located inside and at surfaces of the first wiring substrate 10. A portion of the wiring forms the multiple first terminals 12 at an upper surface 10a of the first wiring substrate 10, and another portion of the wiring forms multiple lower surface pads 13 at a lower surface 10b of the first wiring substrate 10.

A heat dissipation portion 14 is configured by exposing the metallic member from under the insulating member at the upper surface 10a and the lower surface 10b of the first wiring substrate 10. When viewed in plan view, the heat dissipation portion 14 is located at the central portion of the first wiring substrate 10, and the first terminals 12 and the lower surface pads 13 are located at two sides of the heat dissipation portion 14 with the heat dissipation portion 14 interposed. For example, the first terminals 12 and the lower surface pads 13 are arranged along the long sides of the first wiring substrate 10.

The second wiring substrate 20 is located on the heat dissipation portion 14 of the first wiring substrate 10. The second wiring substrate 20 is, for example, a silicon substrate, e.g., an application specific integrated circuit substrate (ASIC substrate) having an embedded integrated circuit. The lower surface of the second wiring substrate 20 is bonded to the upper surface of the heat dissipation portion 14 via a bonding member. For example, a silver paste that includes a silicone resin is an example of the bonding member. The central portion of an upper surface 21 of the second wiring substrate 20 is a region where the light-emitting element 30 is placed. An upper surface pad that is connected to the light-emitting elements 30 is located in this region, and the second terminals 22 that are electrically connected with the upper surface pad are located in the peripheral portion of this region.

The wire 60 is a member for electrically connecting the first wiring substrate 10 and the second wiring substrate 20. The wire 60 is connected to the first terminal 12 of the first wiring substrate 10 and the second terminal 22 of the second wiring substrate 20. For example, gold (Au) is an example of the material of the wire 60. For example, the number of the wires 60 is equal to the number of the first terminals 12. The multiple wires 60 are located along the outer edge of the second wiring substrate and straddle the outer edge of the second wiring substrate 20.

As shown in FIG. 2, FIG. 4, and FIG. 5, the multiple light-emitting elements 30 are placed on the central portion of the upper surface 21 of the second wiring substrate 20. Each light-emitting element 30 is substantially rectangular when viewed in plan view. For example, the multiple light-emitting elements 30 are arranged in a matrix configuration. In an example, four segments each include 64 rows and 64 columns of the light-emitting elements 30 having substantially square upper surfaces, for a total of 16,384 light-emitting elements 30. In an example, the arrangement interval of the light-emitting element 30 is 45 µm to 55 µm, and the length of one side of each light-emitting element 30 is 40 µm to 50 µm. Accordingly, the distance between adjacent light-emitting elements 30 is 5 µm to 15 µm. In an example, the thickness of the light-emitting element 30 is 5 µm to 10 µm. The light-emitting element 30 is connected to the upper surface pad of the upper surface 21 of the second wiring substrate 20. The light-emitting element 30 is, for example, a light-emitting diode (LED) that emits, for example, blue light.

Elements that emit light of any wavelength can be selected as the light-emitting elements 30. For example, a light-emitting element that includes ZnSe, a nitride semiconductor ($In_xAl_yGa_{1-x-y}N$, $0 \leq x$, $0 \leq y$, and $x+y<1$), or GaP can be selected as a light-emitting element emitting blue or green light. A semiconductor such as GaAlAs or AlInGaP can be favorably used as the light-emitting element 30 that emits red light. Furthermore, semiconductor light-emitting elements that are made of other materials also can be used. The composition and the light emission color of the light-emitting element 30 can be selected as appropriate according to the purpose.

The second resin 40 is light-reflective. The second resin 40 is located between the adjacent light-emitting elements 30. The second resin 40 also can be located between the upper surface 21 of the second wiring substrate 20 and the lower surfaces of the light-emitting elements 30. That is, the second resin 40 can cover the side surface and the lower surface of the light-emitting element 30 and leave the upper surface of the light-emitting element 30 exposed. The second resin 40 can cover the entire side surface of the light-emitting element 30, or can leave exposed an upper portion of the side surface linked to the upper surface 21 of the light-emitting element 30. By covering the side surface of the light-emitting element 30 with a light-reflective second resin, more of the light emitted from the light-emitting element 30 can be extracted from the upper surface 21. The second resin 40 includes a base material made of a light-transmitting resin, and a light-reflective substance included in the base material. The light extraction efficiency from the light-emitting element 30 can be increased by increasing the content of the light-reflective substance included in the second resin 40. From the perspective of the increase of the light extraction efficiency and the fluidity of the resin, it is favorable for the concentration of the light-reflective substance in the second resin 40 to be not less than 50% by mass and not more than 70% by mass, e.g., about 60% by mass.

For example, a resin such as silicone, modified silicone, epoxy, modified epoxy, acrylic, or a hybrid resin that includes at least one of these resins can be used as the light-transmitting resin included in the base material of the second resin 40. Among these resins, silicone that has excellent heat resistance and lightfastness is favorable, and a dimethyl silicone resin is more favorable. Dimethyl silicone resins can be favorably used as materials of automotive applications due to their excellent reliability such as high-temperature tolerance, etc.

For example, titanium oxide, aluminum oxide, zinc oxide, barium carbonate, barium sulfate, boron nitride, aluminum nitride, a glass filler, etc., can be favorably used as the light-reflective substance.

As an example, the base material is a dimethyl silicone resin; and the light-reflective substance is titanium oxide. The exterior color of the second resin 40 is white.

The third resin 50 is transmissive and covers the upper surfaces of the light-emitting elements 30 and the upper surface of the second resin 40. The third resin 50 contacts the upper surfaces of the light-emitting elements 30, the upper portions of the side surfaces of the light-emitting elements 30, and the upper surface of the second resin 40. The third resin 50 includes at least a base material made of a light-transmitting resin; and a fluorescer can be included in the base material. In an example, the thickness of the third resin 50 is 25 μm to 35 μm.

Materials similar to the base material of the second resin 40 described above can be used as the base material of the third resin 50. As the fluorescer of the third resin 50, an yttrium-aluminum-garnet-based fluorescer (e.g., $Y_3(Al, Ga)_5O_{12}$:Ce), a lutetium-aluminum-garnet-based fluorescer (e.g., $Lu_3(Al, Ga)_5O_{12}$:Ce), a terbium-aluminum-garnet-based fluorescer (e.g., $Tb_3(Al, Ga)_5O_{12}$:Ce), a CCA-based fluorescer (e.g., $Ca_{10}(PO_4)_6Cl_2$:Eu), an SAE-based fluorescer (e.g., $Sr_4Al_{14}O_{25}$:Eu), a chlorosilicate-based fluorescer (e.g., $Ca_8MgSi_4O_{16}Cl_2$:Eu), an oxynitride-based fluorescer such as β-sialon-based (e.g., $(Si, Al)_3(O, N)_4$:Eu) or α-sialon-based (e.g., $Ca(Si, Al)_{12}(O, N)_{16}$:Eu), an SLA-based fluorescer (e.g., $SrLiAl_3N_4$:Eu), a nitride-based fluorescer such as CASN-based (e.g., $CaAlSiN_3$:Eu) or SCASN-based (e.g., $(Sr, Ca)AlSiN_3$:Eu), a KSF-based fluorescer (e.g., $K_2SiF_6$:Mn), a fluoride-based fluorescer such as KSAF-based (e.g., $K_2Si_{0.99}Al_{0.01}F_{5.99}$:Mn) or MGF-based (e.g., $3.5MgO \cdot 0.5MgF_2 \cdot GeO_2$:Mn), a fluorescer having a perovskite structure (e.g., $CsPb(F, Cl, Br, I)_3$), a quantum dot fluorescer (e.g., CdSe, InP, $AgInS_2$, or $AgInSe_2$), etc., can be used.

The KSAF-based fluorescer can include the composition of the following formula (I).

$$M_2[Si_pAl_qMn_rF_s] \tag{I}$$

In formula (I), M is an alkaline metal and can include at least K. Mn can be a tetravalent Mn ion. p, q, r, and s can satisfy $0.9 \leq p+q+r \leq 1.1$, $0 < q \leq 0.1$, $0 < r \leq 0.2$, and $5.9 \leq s \leq 6.1$. It is favorable to be $0.95 \leq p+q+r \leq 1.05$ or $0.97 \leq p+q+r \leq 1.03$, $0 < q \leq 0.03$, $0.002 \leq q \leq 0.02$, or $0.003 \leq q \leq 0.015$, $0.005 \leq r \leq 0.15$, $0.01 \leq r \leq 0.12$, or $0.015 \leq r \leq 0.1$, and $5.92 \leq s \leq 6.05$ or $5.95 \leq s \leq 6.025$. For example, compositions of $K_2[Si_{0.946}Al_{0.005}Mn_{0.049}F_{5.995}]$, $K_2[Si_{0.942}Al_{0.008}Mn_{0.050}F_{5.992}]$, and $K_2[Si_{0.939}Al_{0.014}Mn_{0.047}F_{5.986}]$ are examples. According to such a KSAF-based fluorescer, a red light emission that has high luminance and a narrow width at half maximum at the light emission peak wavelength can be obtained.

The first resin 70 protects the wires 60 connecting the first wiring substrate 10 and the second wiring substrate 20. When viewed in plan view, the first resin 70 has a rectangular frame shape along the outer edge of the second wiring substrate 20. The first resin 70 is located over the upper surface of the second wiring substrate 20 from the upper surface of the first wiring substrate 10 and covers the first terminals 12 of the first wiring substrate 10, the wires 60, and the second terminals 22 of the second wiring substrate 20. In an example, the height from the upper surface of the second wiring substrate 20 to the apex of the first resin 70 is 200 μm to 500 μm. Here, the apex of the first resin means the highest position of the first resin in a cross section passing through a light-emitting surface 38.

The first resin 70 can be transmissive or light-shielding. It is favorable for the first resin 70 to be light-shielding, and more favorably light-absorbing. Stray light caused by the first resin 70 reflecting light emitted from the light-emitting elements 30 can be suppressed thereby. For example, the first resin 70 is black or gray. The first resin 70 includes at least a base material made of a light-transmitting resin, and can include a light-reflective substance and/or a light-absorbing substance in the base material. Materials similar to the base material of the second resin 40 described above can be used as the base material. Materials similar to the light-reflective substance of the second resin 40 described above can be used as the light-reflective substance. A black pigment such as carbon black or the like, graphite, etc., are examples of the light-absorbing substance.

As shown in FIG. 5, the first resin 70 includes an outer resin frame 71 located on the first wiring substrate 10, an inner resin frame 72 located on the second wiring substrate 20, and a protective resin 73 located between the outer resin frame 71 and the inner resin frame 72. The wires 60 are located inside the protective resin 73. According to the embodiment, for example, the first resin 70 includes the outer resin frame 71, the inner resin frame 72, and the protective resin 73. The protective resin 73 protects the wires; and the outer resin frame 71 and the inner resin frame 72 hold the protective resin 73. The outer resin frame 71 and the inner resin frame 72 are located respectively on the first wiring substrate 10 and on the second wiring substrate 20 with the wires interposed. The protective resin 73 is located in the region between the outer resin frame 71 and the inner resin frame 72. As an example, the outer resin frame 71, the inner resin frame 72, and the protective resin 73 are light-shielding and have, for example, a black appearance. As necessary, the second resin 40, the third resin 50, and the first resin 70 can have different exterior colors and can include colorants, light-diffusing materials, fillers for adjusting the viscosity, etc.

The region of the upper surface of the third resin 50 surrounded with the first resin 70 is used as the light-emitting surface 38 of the light-emitting module 1. In other words, the first resin 70 surrounds the light-emitting surface 38. The multiple light-emitting elements 30 and the second resin 40 are located under the third resin 50 at the light-emitting surface 38. The height from the upper surface of the second wiring substrate 20 to the upper surface of the light-emitting surface 38 is less than the height from the upper surface of the second wiring substrate 20 to the apex of the first resin 70. That is, the light-emitting module 1 includes a recess surrounded with the first resin 70 at the upper surface of the light-emitting module 1. The upper surface of the third resin 50 is exposed from under the first resin 70 at the bottom of the recess and is included in the light-emitting surface 38 of the light-emitting module 1. The light that is emitted from the multiple light-emitting elements 30 is reflected by the second resin 40, enters the third resin 50, and is emitted from the light-emitting surface 38. A portion of the light emitted from the light-emitting surface 38 is reflected and/or absorbed by the first resin 70.

The protective member 80 is located on the first resin 70 and bonded to the first resin 70. The protective member 80 includes the light-transmitting member 81, and the light-shielding film 82 located at the surface of the light-transmitting member 81. The light-shielding film 82 has a frame shape at the surface of the light-transmitting member 81 and covers the frame-shaped first resin 70. The light-transmitting member 81 can have a frame shape similar to the light-shielding film 82, or can have a plate shape covering the light-emitting surface 38 and the first resin 70. The light-transmitting member 81 is made of a light-transmitting material; for example, glass or a resin can be used. Among light-transmitting materials, it is favorable to use glass that is not easily degraded by heat, light from the light-emitting surface, etc. For example, borosilicate glass and quartz glass are examples of the glass. The light-transmitting member 81 has, for example, a rectangular plate shape. The light-transmitting member 81 is, for example, a glass plate. The light-transmitting member 81 covers the first resin 70 when viewed in plan view. It is also favorable for the light-transmitting member 81 to cover the light-emitting surface 38 as well as the first resin 70. In other words, it is favorable for the light-transmitting member 81 to cover the first resin 70 and cover the multiple light-emitting elements 30 when viewed in plan view. The adhesion of external dust, etc., to the light-emitting surface 38 can be suppressed thereby. The protective member 80 acts as a lid for the recess that is surrounded with the first resin 70, thereby forming a space 75 on a light-emitting surface 32 that is shielded from the outside. The space 75 is, for example, an air layer located between the light-emitting surface 32 and the light-transmitting member 81.

The light-transmitting member 81 includes a lower surface 81a and an upper surface 81b. The lower surface 81a faces the first resin 70. The upper surface 81b is at the side opposite to the lower surface 81a and forms a portion of the upper surface of the light-emitting module 1. It is favorable for the thickness of the light-transmitting member 81 to be not less than 0.2 mm and not more than 5.0 mm. By setting the thickness of the light-transmitting member 81 to be not less than 0.2 mm, the light-transmitting member 81 can have sufficient strength. By setting the thickness of the light-transmitting member 81 to be not more than 5.0 mm, the light-emitting module 1 can be thinned. It is more favorable for the thickness of the light-transmitting member 81 to be not less than 1.0 mm and not more than 3.0 mm. By setting the thickness of the light-transmitting member 81 to be not less than 1.0 mm, even when foreign matter adheres to the upper surface 81b of the light-transmitting member 81, the position of the foreign matter can be distant to the light-emitting surface 38, i.e., the focal position of the optical system; therefore, foreign matter can be prevented from affecting the projection image. By setting the thickness of the light-transmitting member 81 to be not more than 3.0 mm, the light-emitting module 1 can be thinned even further.

When viewed in plan view, the light-shielding film 82 has a frame shape that covers the first resin 70 but does not cover the multiple light-emitting elements 30. When viewed in plan view, an inner edge 82i of the light-shielding film 82 is located further inward than an inner edge 70i of the first resin 70. It is favorable for the light-shielding film 82 to jut sufficiently inward with respect to the inner edge 70i of the first resin 70 so that concentrated external light does not reach the first resin 70. It is favorable for the light-shielding film 82 to be located at the lower surface 81a of the light-transmitting member 81, i.e., the surface at the first resin 70 side. The distance between the light-shielding film 82 and the first resin 70 can be reduced by providing the light-shielding film 82 at the lower surface 81a of the light-transmitting member 81; therefore, the inward jutting of the light-shielding film 82 described above can be reduced. That is, the light extraction efficiency can be increased because the surface area of the light-emitting surface 32 exposed from under the light-shielding film 82 when viewed in plan view can be increased. In an example, when the width of the first resin 70 when viewed in plan view is 260 μm, it is favorable for the jutting amount of the light-shielding film 82, i.e., the minimum distance between the inner edge 82i and the inner edge 70i when viewed in plan view, to be not less than 200 μm. In such a case, it is favorable for all of the multiple light-emitting elements 30 to be separated from the light-shielding film 82 when viewed in plan view.

As shown in JIG. 7, the light-shielding film 82 includes a lower layer 83 positioned at the first resin 70 side, and an upper layer 84 located higher than (i.e., at the light-transmitting member 81 side of) the lower layer 83. The lower layer 83 has a higher optical absorptance than the upper layer 84. In the specification, "optical absorptance" is the absorptance for the light emitted by the light-emitting elements 30. By setting the optical absorptance of the lower layer 83 to be high, the light that is emitted from the light-emitting elements 30 can be effectively absorbed by the lower layer 83, and stray light can be suppressed.

On the other hand, the upper layer 84 has a higher light reflectance than the lower layer 83. In the specification, "light reflectance" refers to the light reflectance to external light such as sunlight, refers to the reflectance to, for example, visible light, and refers to the reflectance to, for example, light of a wavelength of 400 nm. For example, the upper layer 84 has a reflectance of not less than 75% to light of a wavelength of 400 nm. Thereby, external light such as sunlight or the like is effectively reflected by the upper layer 84 of the light-shielding film 82 even when concentrated at the light-emitting surface vicinity of the light-emitting module 1; therefore, the concentration at the first resin 70 and the resulting damage of the resin can be suppressed.

For example, the lower layer 83 includes a chromium oxide layer, and, for example, a layer in which a chromium oxide layer 83a and a chrome layer 83b are stacked. The chromium oxide layer 83a is made of chromium oxide ($Cr_2O_3$) and has a black exterior color. The chrome layer 83b is made of chrome and has an appearance with metallic luster. For example, the upper layer 84 includes at least one type of metal selected from the group consisting of aluminum (Al), silver (Ag), and gold (Au) and is, for example, a layer in which an aluminum oxide layer 84a and an aluminum layer 84b are stacked. The aluminum oxide layer 84a is made of aluminum oxide ($Al_2O_3$); and the aluminum layer 84b is made of aluminum. In such a case, in the light-shielding film 82, the aluminum layer 84b, the alumina layer 84a, the chrome layer 83b, and the chromium oxide layer 83a are stacked in this order downward from the light-transmitting member 81 side, i.e., toward the first resin 70 side. The lower layer 83 can be formed of a resin material that includes a light-absorbing substance.

Effects of the embodiment will now be described.

The light-emitting module 1 according to the embodiment includes the protective member 80 that is located on the first resin 70. The protective member 80 includes the light-transmitting member 81 that covers the first resin, and the light-shielding film 82 that is located at the surface of the light-transmitting member 81 and covers the first resin 70. Thereby, when the light-emitting module 1 is used as the light source of a headlamp of a vehicle, even when external light such as sunlight or the like travels backward through the optical system and is concentrated at the light-emitting module 1 vicinity, the damage of the first resin 70 due to the external light can be suppressed because the light-shielding film 82 shields the external light.

Because the first resin 70 is black, the reflection by the first resin 70 of the light emitted from the light-emitting elements 30 can be suppressed, and the occurrence of stray light is suppressed. If the light-shielding film 82 is not located at the surface of the light-transmitting member 81, there is a possibility that the first resin 70 may be burned when sunlight is concentrated at the black first resin 70; however, according to the embodiment, burning of the first resin 70 can be suppressed because the protective member 80 includes the light-shielding film 82.

The light-shielding film 82 can suppress the degradation of the first resin 70 by external light because the upper layer 84 has high light reflectance and can effectively reflect the external light. The first resin 70 that protects the wires can be effectively protected thereby, which increases the reliability of the light-emitting module. Also, by setting the optical absorptance of the lower layer 83 to be high, the light that is emitted from the light-emitting elements 30 can be effectively absorbed, and the occurrence of stray light can be effectively suppressed. Thereby, a highly-accurate projection is possible when using the light-emitting module 1 as the light source of a headlamp of a vehicle. Thus, both protection from external light and suppression of stray light can be realized by the light-shielding film 82 having a stacked structure including the upper layer 84 that has a higher light reflectance and the lower layer 83 that has a higher optical absorptance.

According to the embodiment, the inner edge 82i of the light-shielding film 82 is located further inward than the inner edge 70i of the first resin 70 when viewed in plan view. It is therefore more difficult for external light to reach the first resin 70; and the first resin 70 can be more reliably protected from the external light.

According to the embodiment, the light-shielding film 82 is located at the lower surface 81a of the light-transmitting member 81. The distance between the light-shielding film 82 and the first resin 70 in the Z-direction can be reduced thereby, and the first resin 70 can be sufficiently protected even without providing the inner edge 82i of the light-shielding film 82 excessively inward with respect to the inner edge 70i of the first resin 70. As a result, the shielding by the light-shielding film 82 of the light emitted from the light-emitting elements 30 can be suppressed, and the light extraction efficiency of the light-emitting module 1 is increased.

Because the light-transmitting member 81 covers the multiple light-emitting elements 30, the light-emitting elements 30 can be protected from moisture, foreign matter flying in from the outside, etc.

First Modification of First Embodiment

Figure 8:
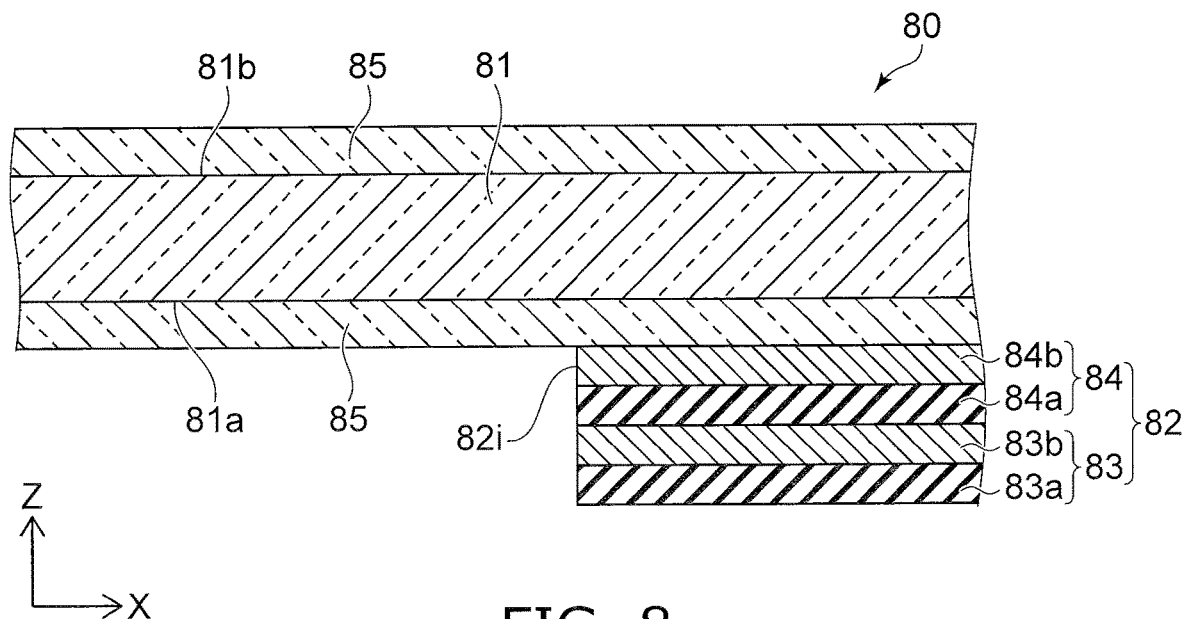
FIG. 8 is a cross-sectional view showing a protective member of a first modification of the first embodiment.

FIG. 8 is a cross-sectional view showing a protective member of a first modification of the first embodiment.

As shown in FIG. 8, the light-emitting module according to the modification differs from the first embodiment in that the protective member 80 includes an anti-reflection coating 85 on at least one of the lower surface 81a or the upper surface 81b of the light-transmitting member 81.

In the example shown in FIG. 8, the anti-reflection coating 85 of the protective member 80 is located at both the lower surface 81a and the upper surface 81b of the light-transmitting member 81. The light-shielding film 82 is located under the anti-reflection coating 85 located at the lower surface 81a of the light-transmitting member 81. In other words, the anti-reflection coating 85 that is located at the lower surface 81a of the light-transmitting member 81 is located between the light-shielding film 82 and the lower surface 81a of the light-transmitting member 81. Transmissive films of silicon oxide ($SiO_2$), zirconium oxide ($ZrO_2$), etc., can be used as single layers or a multilayer film as the anti-reflection coating 85.

According to the modification, because the protective member 80 includes the anti-reflection coating 85, the reflection by the light-transmitting member 81 of the light emitted from the light-emitting elements 30 can be suppressed, and the light extraction efficiency of the light-emitting module can be increased. Otherwise, the configuration and the effects of the modification are similar to those of the first embodiment.

Second Modification of First Embodiment

Figure 9:
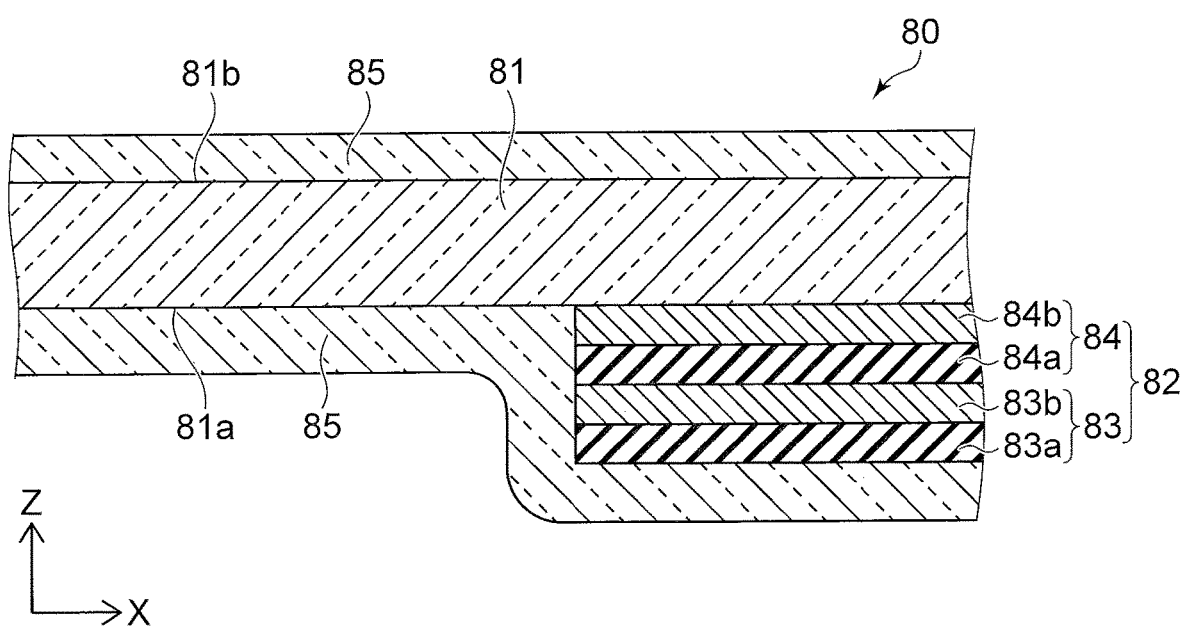
FIG. 9 is a cross-sectional view showing a protective member of a second modification of the first embodiment.

FIG. 9 is a cross-sectional view showing a protective member of a second modification of the first embodiment.

As shown in FIG. 9, the light-emitting module according to the modification differs from the first modification in that the anti-reflection coating 85 of the protective member 80 covers the light-shielding film 82. In other words, in the protective member 80, the light-shielding film 82 is located between the lower surface 81a of the light-transmitting member 81 and the anti-reflection coating 85 located at the lower surface 81a side of the light-transmitting member 81. Otherwise, the configuration and the effects of the embodiment are similar to those of the first modification.

Second Embodiment

Figure 10:
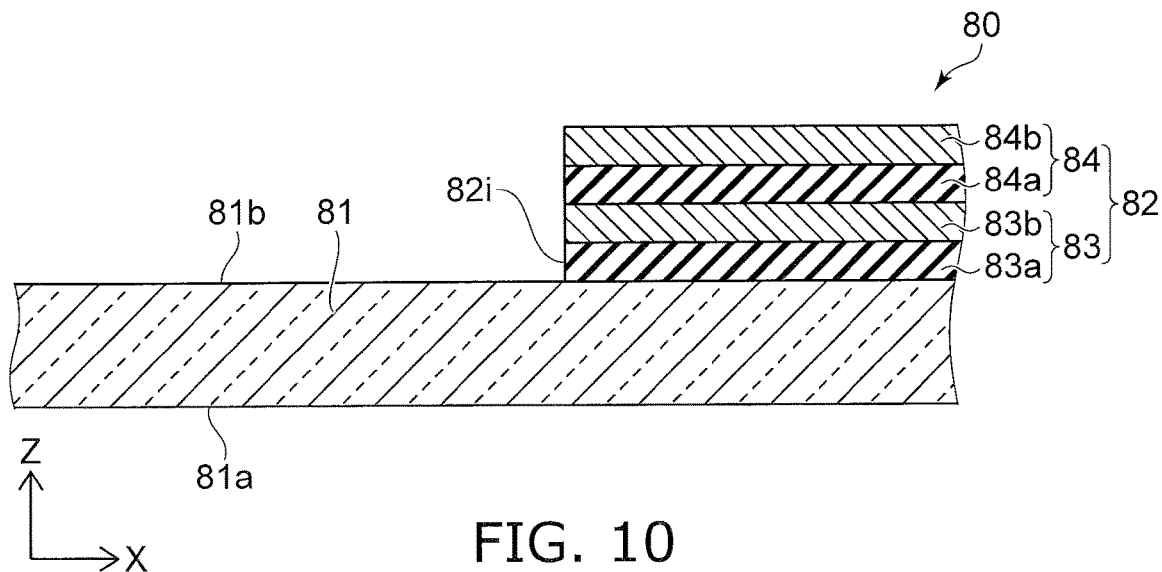
FIG. 10 is a cross-sectional view showing a protective member according to a second embodiment.

FIG. 10 is a cross-sectional view showing a protective member according to a second embodiment.

According to the embodiment as shown in FIG. 10, the protective member 80 includes the light-shielding film 82 at the upper surface 81b of the light-transmitting member 81. The light-shielding film 82 includes the upper layer 84 and the lower layer 83, and the lower layer 83 is located further toward the first resin 70 side than the upper layer 84, that is, at the light-transmitting member 81 side of the upper layer 84. The light-shielding film 82 includes, for example, the chromium oxide layer 83a, the chrome layer 83b, the alumina layer 84a, and the aluminum layer 84b stacked in this order upward from the light-transmitting member 81 side, that is, in the direction away from the first resin 70.

Otherwise, the configuration according to the embodiment is similar to that of the first embodiment. According to the embodiment as well, the light that is emitted from the light-emitting elements 30 can be effectively absorbed, and the occurrence of stray light can be effectively suppressed. According to the embodiment as well, similarly to the first or second modification of the first embodiment, the protective member 80 can include the anti-reflection coating 85 on at least one of the lower surface 81a or the upper surface 81b of the light-transmitting member 81.

Third Embodiment

Figure 11:
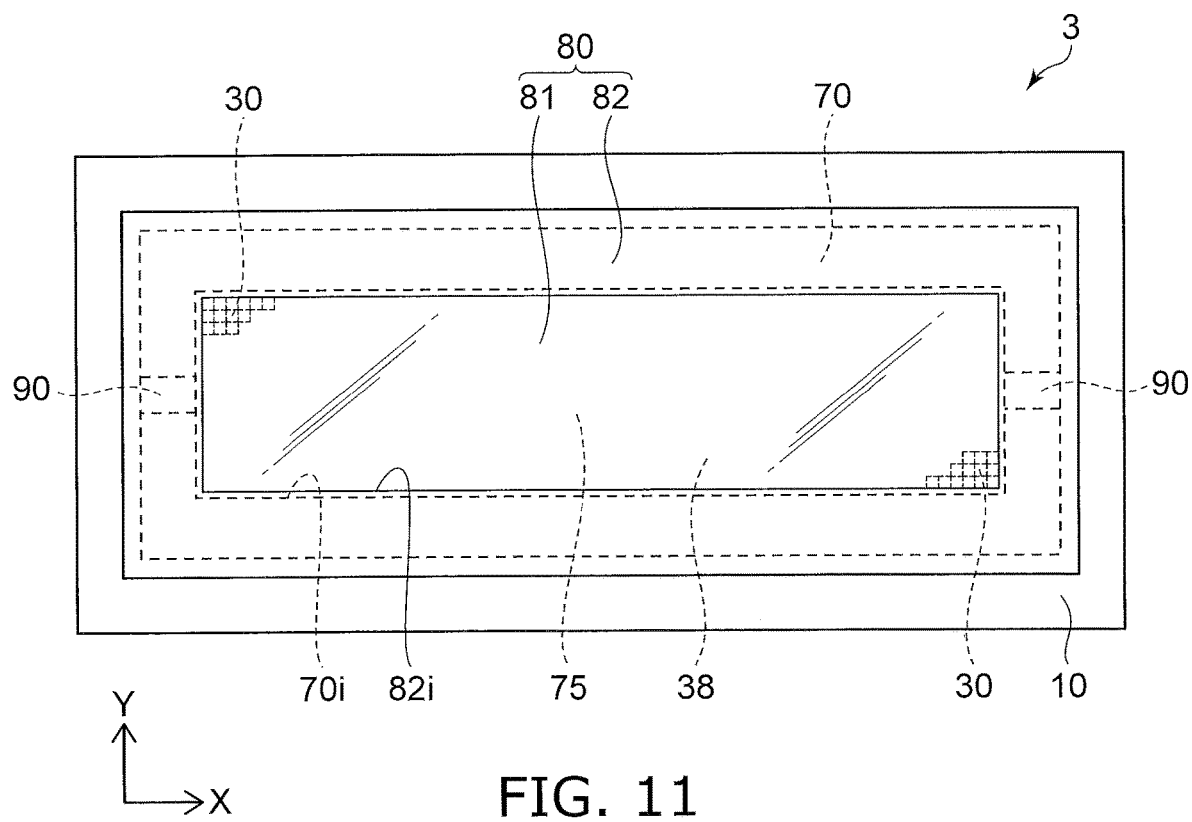
FIG. 11 is a plan view showing a light-emitting module according to a third embodiment.

FIG. 11 is a plan view showing a light-emitting module according to a third embodiment.

Figure 12:
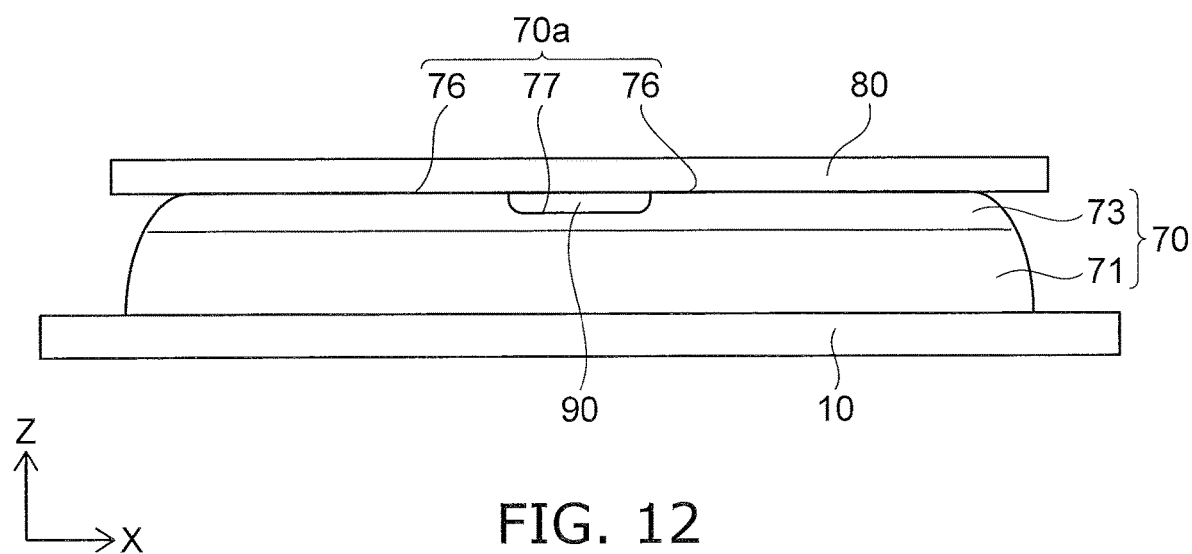
FIG. 12 is a side view showing the light-emitting module according to the third embodiment.

FIG. 12 is a side view showing the light-emitting module according to the embodiment.

As shown in FIGS. 11 and 12, the light-emitting module 3 according to the embodiment includes a ventilation portion 90 between the first resin 70 and the protective member 80. The ventilation portion 90 is a gap that links the space 75 surrounded with the first resin 70 to the outside. The ventilation portion 90 is, for example, a trench located at an upper surface 70a of the first resin 70. The upper surface 70a of the first resin 70 includes a bonding region 76 that is bonded with the protective member 80, and a non-bonding region 77 that is not bonded with the protective member 80. In the light-emitting module 3, the bonding region 76 is located higher than the non-bonding region 77, and the ventilation portion 90 is formed between the non-bonding region 77 and the protective member 80. When viewed in plan view, for example, the ventilation portion 90 is located at short-side portions of the rectangular frame-shaped first resin 70. In other words, the ventilation portion 90 extends in the X-direction at the two Y-direction end portions of the first resin.

A method for forming the ventilation portion 90 will now be described.

FIGS. 13A to 13D are cross-sectional views showing the method for forming the ventilation portion according to the embodiment.

Figure 13A:
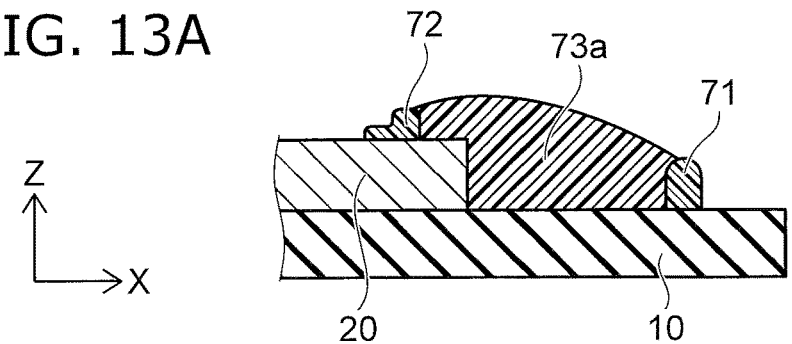
FIGS. 13A to 13D are cross-sectional views showing a method for forming a ventilation portion according to the third embodiment.

As shown in FIG. 13A, the outer resin frame 71 is formed on the first wiring substrate 10; and the frame-shaped inner resin frame 72 is formed on the second wiring substrate 20. Then, an uncured resin material is disposed between the outer resin frame 71 and the inner resin frame 72 and cured. A lower layer resin layer 73a is formed thereby.

Figure 13B:
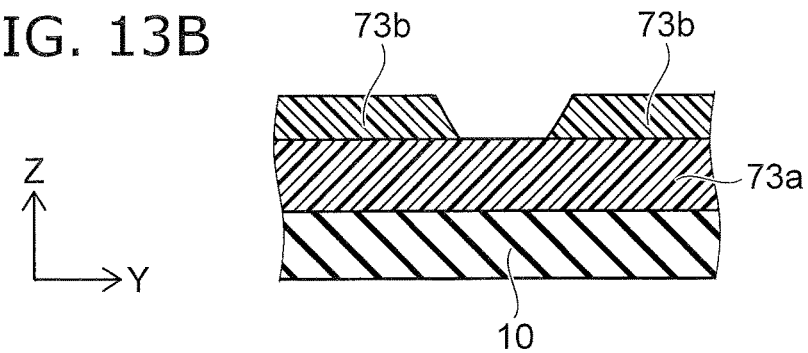

Then, as shown in FIG. 13B, an uncured resin material 73b is selectively disposed on the lower layer resin layer 73a. For example, the resin material 73b is dispensed from a dispenser in paste form. At this time, the resin material 73b is not located on the region at which the ventilation portion 90 is to be formed.

Figure 13C:
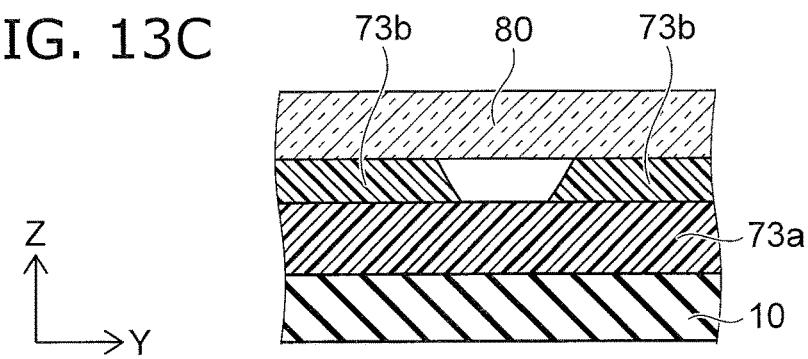

Continuing as shown in FIG. 13C, the protective member 80 is disposed on the resin material 73b.

Figure 13D:
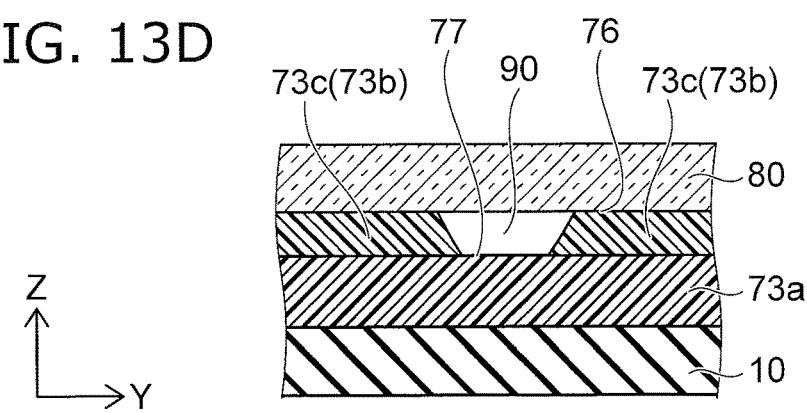

Then, as shown in FIG. 13D, the resin material 73b is cured while in contact with the protective member 80. An upper layer resin layer 73c is formed thereby. The upper layer resin layer 73c is bonded to the protective member 80.

The protective resin 73 is formed of the lower layer resin layer 73a and the upper layer resin layer 73c. The first resin 70 is formed of the outer resin frame 71, the inner resin frame 72, and the protective resin 73. At this time, the region at which the upper layer resin layer 73c is not located on the lower layer resin layer 73a is the ventilation portion 90. Also, the region of the upper surface of the lower layer resin layer 73a that is not covered with the upper layer resin layer 73c is the non-bonding region 77, and the region of the upper surface of the upper layer resin layer 73c that contacts the protective member 80 is the bonding region 76. In other words, the non-bonding region 77 is cured before placing the protective member 80, and the bonding region 76 is cured after placing the protective member 80.

Effects of the embodiment will now be described.

According to the embodiment, by providing the ventilation portion 90, the space 75 that is surrounded with the first resin 70 communicates with the outside. Therefore, when manufacturing or using the light-emitting module 3, the pressure inside the space 75 is not different from the outside pressure; and a force that is caused by the air pressure difference between the space 75 and the outside is not applied to the first resin 70 and the protective member 80. As a result, the reliability of the light-emitting module 3 is increased.

By providing the ventilation portion 90 in the short-side portion of the first resin 70, the wires 60 are not exposed at the ventilation portion 90. However, the ventilation portion 90 can be located at the long-side portion of the first resin 70 as long as there is no risk of exposing the wires 60. Otherwise, the configuration and the effects according to the embodiment are similar to those of the first embodiment.

Modification of Third Embodiment

A method for forming the ventilation portion of a modification of the third embodiment is different from that of the third embodiment.

FIGS. 14A to 14D are cross-sectional views showing the method for forming the ventilation portion of the modification.

First, similarly to the third embodiment, the outer resin frame 71 is formed on the first wiring substrate 10 as shown in FIG. 13A, and the frame-shaped inner resin frame 72 is formed on the second wiring substrate 20. Then, the lower layer resin layer 73a is formed by disposing an uncured resin material between the outer resin frame 71 and the inner resin frame 72 and by curing.

Figure 14A:
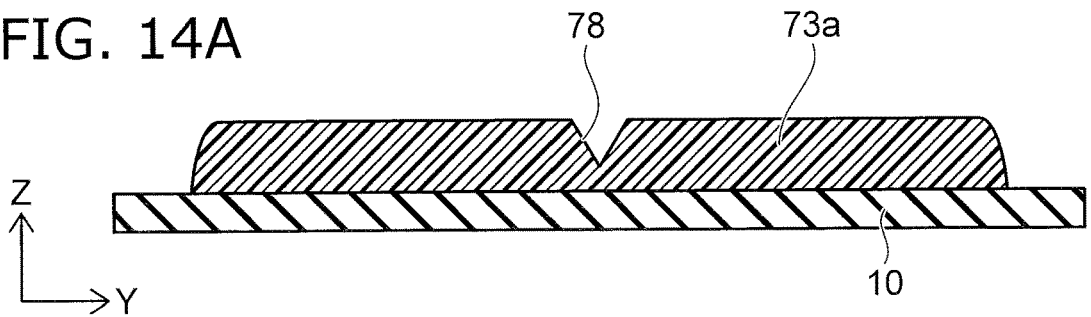
FIGS. 14A to 14D are cross-sectional views showing a method for forming a ventilation portion of a modification of the third embodiment.

Then, as shown in FIG. 14A, a notch 78 is formed in the structure body made of the outer resin frame 71, the inner resin frame 72, and the lower layer resin layer 73a. The notch 78 forms the ventilation portion 90 when viewed in plan view.

Figure 14B:
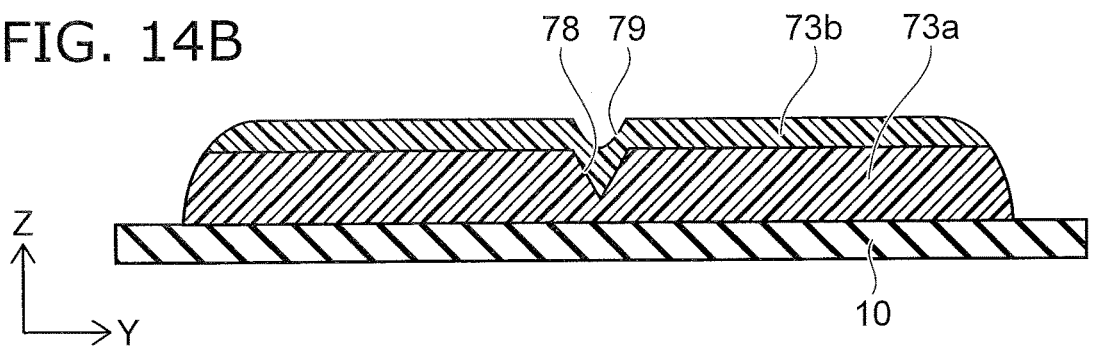

Continuing as shown in FIG. 14B, the uncured resin material 73b is disposed on the lower layer resin layer 73a. At this time, a trench 79 that reflects the notch 78 is formed in the upper surface of the resin material 73b.

Figure 14C:
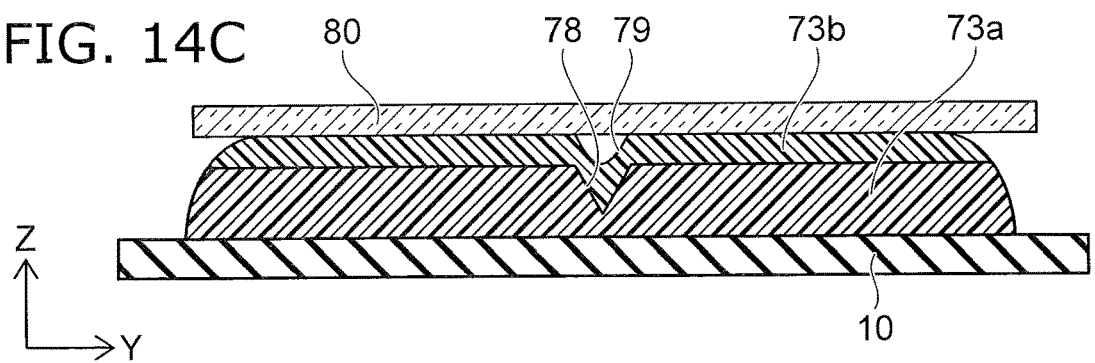

Then, as shown in FIG. 14C, the protective member 80 is disposed on the resin material 73b.

Figure 14D:
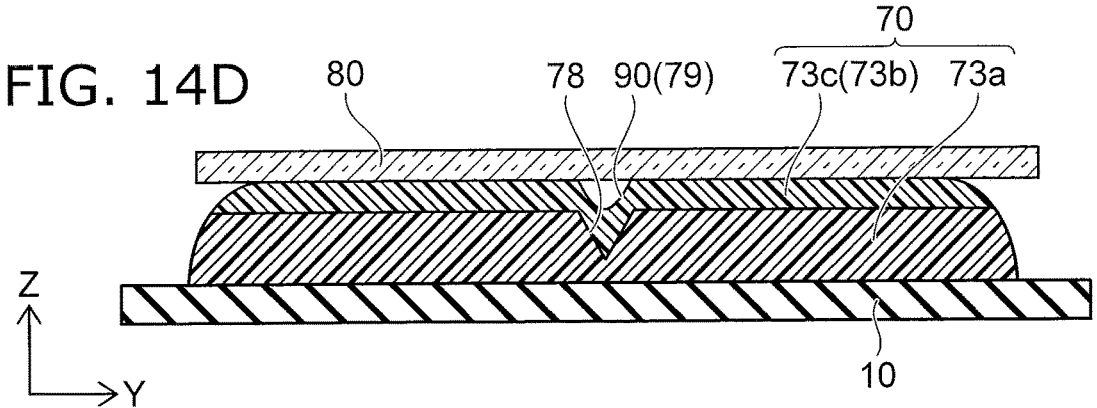

Continuing as shown in FIG. 14D, the resin material 73b is cured. The upper layer resin layer 73c is formed thereby. The upper layer resin layer 73c is bonded to the protective member 80. The trench 79 becomes the ventilation portion 90 at this time.

According to the modification, the position and size of the ventilation portion 90 can be controlled by the position and size of the notch 78. The position and size of the ventilation portion 90 can be easily controlled thereby. Otherwise, the configuration, the formation method, and the effects of the modification are similar to those of the third embodiment.

Embodiments and their modifications described above are examples embodying the invention; and the invention is not limited to these embodiments and their modifications. For example, additions, deletions, or modifications of some of the components or processes of embodiments and their modifications described above also are included in the invention. Embodiments and their modifications described above also can be implemented in combination with each other.

For example, the invention can be utilized as a light source of a vehicle headlight, a display device, etc.

Embodiments include the following aspects.

Note 1. A light-emitting module, comprising:

a first wiring substrate;

a second wiring substrate located on the first wiring substrate;

a plurality of light-emitting elements located on the second wiring substrate;

a wire connecting a first terminal of the first wiring substrate and a second terminal of the second wiring substrate;

a first resin located on the first wiring substrate and on the second wiring substrate, the first resin covering the wire and surrounding the plurality of light-emitting elements when viewed in plan view; and a protective member located on the first resin, the protective member including a light-transmitting member covering the first resin when viewed in plan view, and a light-shielding film located at a surface of the light-transmitting member, the light-shielding film covering the first resin when viewed in plan view.

Note 2. The module according to note 1, wherein the light-transmitting member covers the plurality of light-emitting elements when viewed in plan view.

Note 3. The module according to notes 1 or 2, wherein the light-transmitting member is made of glass.

Note 4. The module according to any one of notes 1 to 3, wherein a thickness of the light-transmitting member is not less than 0.2 mm and not more than 5.0 mm.

Note 5. The module according to any one of notes 1-4, wherein the light-shielding film is located at a surface of the light-transmitting member at the first resin side.

Note 6. The module according to any one of notes 1-5, wherein the light-shielding film has a frame shape when viewed in plan view, and an inner edge of the light-shielding film is located further inward than an inner edge of the first resin when viewed in plan view.

Note 7. The module according to any one of notes 1-6, wherein the light-shielding film includes:

a lower layer positioned at the first resin side; and an upper layer located higher than the lower layer, the upper layer having a higher light reflectance than the lower layer.

Note 8. The module according to note 7, wherein the lower layer has a higher optical absorptance than the upper layer.

Note 9. The module according to any one of notes 1 to 6, wherein the light-shielding film includes:

a lower layer positioned at the first resin side, the lower layer including chrome; and an upper layer located higher than the lower layer, the upper layer including aluminum.

Note 10. The module according to any one of notes 1 to 9, wherein an upper surface of the first resin includes:

a bonding region bonded with the protective member; and a non-bonding region not bonded with the protective member.

Note 11. The module according to any one of notes 1 to 10, wherein the module has a ventilation portion between the first resin and the protective member, the ventilation portion links a space surrounded with the first resin to a space outside the module.

Note 12. The module according to note 11, wherein the ventilation portion is a trench located in an upper surface of the first resin.

Note 13. The module according to any one of notes 1 to 12, wherein the first resin is black.

What is claimed is:

1. A light-emitting module comprising:

a first wiring substrate;

a second wiring substrate located on the first wiring substrate;

a plurality of light-emitting elements located on the second wiring substrate;

a wire connecting a first terminal of the first wiring substrate and a second terminal of the second wiring substrate;

a first resin located on the first wiring substrate and on the second wiring substrate, the first resin covering the wire and surrounding the plurality of light-emitting elements when viewed in plan view; and a protective member located on the first resin, wherein the protective member includes:

a light-transmitting member covering the first resin when viewed in plan view; and a light-shielding film located at a surface of the light-transmitting member, the light-shielding film covering the first resin when viewed in plan view, the light-shielding film includes:

a lower layer positioned at a first resin side of the light-shielding film; and an upper layer located higher than the lower layer, and the upper layer has a higher light reflectance than the lower layer.

2. The module according to claim 1, wherein the light-transmitting member covers the plurality of light-emitting elements when viewed in plan view.

3. The module according to claim 1, wherein the light-transmitting member is glass.

4. The module according to claim 1, wherein a thickness of the light-transmitting member is not less than 0.2 mm and not more than 5.0 mm.

5. The module according to claim 1, wherein the light-shielding film is located at the surface of the light-transmitting member at a first resin side of the light transmitting member.

6. The module according to claim 1, wherein the light-shielding film has a frame shape when viewed in plan view, and an inner edge of the light-shielding film is located further inward than an inner edge of the first resin when viewed in plan view.

7. The module according to claim 1, wherein the lower layer has a higher optical absorptance than the upper layer.

8. A light-emitting module comprising:

a first wiring substrate;

a second wiring substrate located on the first wiring substrate;

a plurality of light-emitting elements located on the second wiring substrate;

a wire connecting a first terminal of the first wiring substrate and a second terminal of the second wiring substrate;

a first resin located on the first wiring substrate and on the second wiring substrate, the first resin covering the wire and surrounding the plurality of light-emitting elements when viewed in plan view; and a protective member located on the first resin, wherein the protective member includes:
- a light-transmitting member covering the first resin when viewed in plan view; and
- a light-shielding film located at a surface of the light-transmitting member, the light-shielding film covering the first resin when viewed in plan view, and the light-shielding film includes:
- a lower layer positioned at a first resin side of the light-shielding film, the lower layer including chrome; and
- an upper layer located higher than the lower layer, the upper layer including aluminum.

9. The module according to claim 1, wherein an upper surface of the first resin includes:
- a bonding region bonded with the protective member; and
- a non-bonding region not bonded with the protective member.

10. The module according to claim 1, wherein the module has a ventilation portion between the first resin and the protective member, and the ventilation portion links a space surrounded with the first resin to a space outside the module.

11. The module according to claim 10, wherein the ventilation portion is a trench located in an upper surface of the first resin.

12. The module according to claim 1, wherein the first resin is black.

13. The module according to claim 8, wherein the module has a ventilation portion between the first resin and the protective member, and the ventilation portion links a space surrounded with the first resin to a space outside the module.

14. A light-emitting module comprising:
- a first wiring substrate;
- a second wiring substrate located on the first wiring substrate;
- a plurality of light-emitting elements located on the second wiring substrate;
- a wire connecting a first terminal of the first wiring substrate and a second terminal of the second wiring substrate;
- a first resin located on the first wiring substrate and on the second wiring substrate, the first resin covering the wire and surrounding the plurality of light-emitting elements when viewed in plan view; and
- a protective member located on the first resin, wherein the protective member includes:
  - a light-transmitting member covering the first resin when viewed in plan view; and
  - a light-shielding film located at a surface of the light-transmitting member, the light-shielding film covering the first resin when viewed in plan view, the module has a ventilation portion between the first resin and the protective member, and the ventilation portion links a space surrounded with the first resin to a space outside the module.

15. The module according to claim 14, wherein the light-shielding film includes:
- a lower layer positioned at a first resin side of the light-shielding film; and
- an upper layer located higher than the lower layer, and the upper layer having a higher light reflectance than the lower layer.

16. The module according to claim 15, wherein the lower layer has a higher optical absorptance than the upper layer.

17. The module according to claim 14, wherein the light-shielding film includes:
- a lower layer positioned at a first resin side of the light-shielding film, the lower layer including chrome; and
- an upper layer located higher than the lower layer, the upper layer including aluminum.

* * * * *